United States Patent
Chadwick

(10) Patent No.: US 6,844,788 B2
(45) Date of Patent: Jan. 18, 2005

(54) POLAR LOOP TRANSMITTER

(75) Inventor: Peter Edward Chadwick, Swindon (GB)

(73) Assignee: Zarlink Semiconductor Limited, Swindon (GB)

( * ) Notice: Subject to any disclaimer, the term of this patent is extended or adjusted under 35 U.S.C. 154(b) by 0 days.

(21) Appl. No.: 10/267,905

(22) Filed: Oct. 9, 2002

(65) Prior Publication Data

US 2003/0067994 A1 Apr. 10, 2003

(30) Foreign Application Priority Data

Oct. 10, 2001 (GB) ............................................. 0124332

(51) Int. Cl.[7] .............................................. H03C 1/02
(52) U.S. Cl. ...................... 332/159; 332/162; 375/295; 330/136; 455/109; 455/115; 455/126
(58) Field of Search .................. 332/159, 162; 455/109, 126, 115; 375/295; 330/136, 259, 260, 261; 331/1 A, 74, 16

(56) References Cited

U.S. PATENT DOCUMENTS

| 4,618,999 A | 10/1986 | Watkinson |
| 2003/0073419 A1 * | 4/2003 | Chadwick |

FOREIGN PATENT DOCUMENTS

| EP | 0 954 096 A2 | 11/1999 |
| EP | 1 017 162 A2 | 7/2000 |
| GB | 2 331 881 | 2/1999 |
| GB | 0124332.8 | 5/2002 |

OTHER PUBLICATIONS

Petrovic and Kaya in their paper "Spurious Emissions from EER Type Transmitters," ISBN 0903748630, Dec. 1985, pp 181–8.
Gosling and Petrovic in Electronics Letters, 1979, 15 (10) pp 286–288.
Kahn "Single Sideband Transmission by Envelope Elimination and Restoration," Proc. IRE 1952, 40, pp 803–806.
Petrovic and Kaya in their paper "Spurious Emissions from EER Type Transmitters," ISBN 0903748630, pp 181–8.

* cited by examiner

Primary Examiner—Arnold Kinkead
(74) Attorney, Agent, or Firm—Dority & Manning, P.A.

(57) ABSTRACT

A polar loop transmitter circuit arrangement includes a circuit input, a circuit output, a controllable signal source, a modulator connected between the signal source and the output, a first amplifier having its input connected to the circuit input, a second amplifier having its input connected to the circuit output, and a comparator. Each amplifier preferably includes respective amplitude detector and signal modifier portions connected in series between their respective inputs and outputs. An output of each of the amplifiers is connected to a respective input of the comparator, and an output of the comparator is connected to a control input of the modulator. The amplifiers may each be characterized by transfer functions that are generally logarithmic. Each amplifier's signal modifier portion may further include an analog-to-digital converter, a digital signal modifier, and a digital-to-analog converter. Additional signal mixer and/or phase comparison elements may also be incorporated into select embodiments of the subject polar loop transmitter technology.

20 Claims, 4 Drawing Sheets

POLAR LOOP TRANSMITTER

CROSS-REFERENCE TO RELATED APPLICATIONS

The present application claims priority to currently pending United Kingdom Patent Application number 0124332.8, filed on Oct. 10, 2001.

STATEMENT REGARDING FEDERALLY SPONSORED RESEARCH OR DEVELOPMENT

N/A

BACKGROUND OF THE INVENTION

The polar loop transmitter was first described by Gosling and Petrovic in Electronics Letters, 1979, 15 (10) pp 286–288. This was a development of the work of Kahn "Single Sideband Transmission by Envelope Elimination and Restoration," Proc. IRE 1952, 40, pp 803–806. The basic scheme of the polar loop transmitter is shown in FIG. 1.

Referring to FIG. 1, the transmitter 100 generally comprises an RF input 101 to which is applied in use an input signal, and a voltage controlled oscillator (VCO) 102. A signal output of the VCO 102 is fed via a controllable gain amplifier 104 to an RF output 103, to provide a modulated RF output signal. Similarly, the RF output 103 is connected both to a second amplitude detector 107 and to a second limiting amplifier 108. This arrangement, therefore, separates both input signals and output signals into amplitude and phase components.

The outputs of the limiting amplifiers 106, 108 are connected to respective inputs of a phase comparator 109, which generates a signal on its output which is proportional to the difference in phase between respective signals at RF input 101 and RF output 103. The output of the phase comparator 109 is connected to a control input of the VCO 102, via a low-pass filter 110, to control the phase of the signal generated by the VCO in order to minimize the phase difference. This arrangement thus constitutes a phase locked loop.

Instead of being coupled to the output of the amplifier 104, the input of the limiting amplifier 108 may be coupled directly to the output of the VCO 102. This variant is not so beneficial since there is no compensation of amplitude to phase variations introduced in the amplifier 104. Outputs of the amplitude detectors 105 and 107 are connected to respective inputs of a comparator 111, which provides a signal on its output dependent on the difference in the instantaneous amplitudes of the respective signals at RF input 101 and RF output 103. The output of the comparator 111 is connected to a gain control input of the controllable amplifier 104, via a second low-pass filter 112. The controllable gain amplifier 104 is, therefore, caused to modulate the output of the VCO 102 so that its amplitude follows variations in the amplitude of the input signal.

The polar loop transmitter 100 suffers certain disadvantages when the variation in input signal amplitude is large, namely that any phase modulation to amplitude modulation conversion caused by the limiting amplifiers 106 and 108 add unwanted phase modulation to the output signal as the amplitude of the input signal varies. In addition, with large RF input signal variations, the difference between the signals at the inputs of the comparator 111 becomes small when the output signal is small, increasing distortion at low instantaneous signal levels. These problems were discussed by Petrovic and Kaya in their paper "Spurious Emissions from EER Type Transmitters," ISBN 0903748630, pp 181–8. Furthermore, any distortion introduced by the amplitude detectors 105 and 107 appears in the output signal. To minimize this latter effect, it is desirable to control carefully the amplitudes of the signals provided to the amplitude detectors 105 and 107.

OBJECTS AND SUMMARY OF THE INVENTION

Objects and advantages of the invention will be set forth in part in the following description, or may be obvious from the description, or may be learned through practice of the invention.

The present technology offers many advantages for polar loop transmitter circuits. More particularly, aspects of the exemplary polar loop transmitter circuit arrangements provided herein provide for careful control of selected signal amplitudes to compensate for any phase variations introduced in such circuit arrangements. When utilizing logarithmic amplifiers in accordance with the present subject matter, additional advantages may be present since the phase of the logarithmic amplifier output signal does not vary with the amplitude of the input signal.

Yet another advantage of aspects of the present technology, especially the amplifiers utilized in the subject polar loop transmitter embodiments, is versatility in design and operation of the amplifier and detector components. Exemplary amplifier designs are disclosed with an ability to afford a variety of different transfer functions and signal modification for signals therein.

These and other objects and advantages of the presently disclosed technology may be achieved by improved polar loop transmitter circuits, several exemplary embodiments of which are presented herein. In one exemplary embodiment, a polar loop transmitter circuit arrangement includes a circuit input, a circuit output, a controllable signal source, a modulator, first and second amplifiers, and a comparator. The modulator is preferably connected between the signal source and the circuit output. The first amplifier has an input connected to the circuit input, while the second amplifier has an input connected to the circuit output. The comparator preferably receives the output of each of the amplifiers and provides its output to a control input of the modulator. Each amplifier preferably further comprises an amplitude detector and signal modifier connected in series between their respective inputs and outputs.

In accordance with more particular aspects of the present technology, the amplifiers of the aforementioned exemplary polar loop transmitter embodiment may each have a transfer function that is generally logarithmic. Furthermore, each amplifier's signal modifier may further comprise a series combination of an analog-to-digital converter, a digital signal modifier, and a digital-to-analog converter. In some embodiments, the digital signal modifier portions of the amplifier may further include memory containing a look-up table. Such memory may be reprogrammable to compensate for changes in operating conditions. In still other embodiments of the disclosed technology, a mixer, for example an image-reject mixer, is connected between the circuit output and the input of the second amplifier. In other embodiments, a power control device is connected to a third input of the comparator such that shaping of rising and falling power levels of the signal at the circuit output is afforded thus reducing the effects of signal "splatter" or "key clicks."

Still further aspects of the present technology may provide for additional embodiments of the present subject matter. Some such embodiments may further include a phase comparator configured to receive as inputs an output of the first amplifier and an output of the second amplifier and provide an output connected to a control input of the controllable signal source. Other embodiments may further include a first low-pass filter connected between the comparator and the output and the control input of the modulator as well as a second low-pass filter connected between the phase comparator output and the control input of the signal source. Some embodiments concern having a circuit input that comprises first and second input nodes for receiving respective inphase and quadrature components of an input signal.

Additional object and advantages of the invention will be set forth in part in the description that follows, and in part will be obvious from the description, or may be learned through practice of the invention. The objects and advantages of the invention may be realized and attained by means of the instrumentalities and combinations particularly pointed out in the appended claims.

The accompanying drawings, which are incorporated in and constitute a part of this specification, illustrate at least one presently preferred embodiment of the invention as well as some alternative embodiments. These drawings, together with the description, serve to explain the principles of the invention but by no means are intended to be exhaustive of all the possible manifestations of the invention.

BRIEF DESCRIPTION OF THE DRAWINGS

The above and other aspects, features, and advantages of the present subject matter will be more apparent from the following more particular description of exemplary embodiments of the disclosed technology as set forth in the appended figures, in which.

Figure 1:
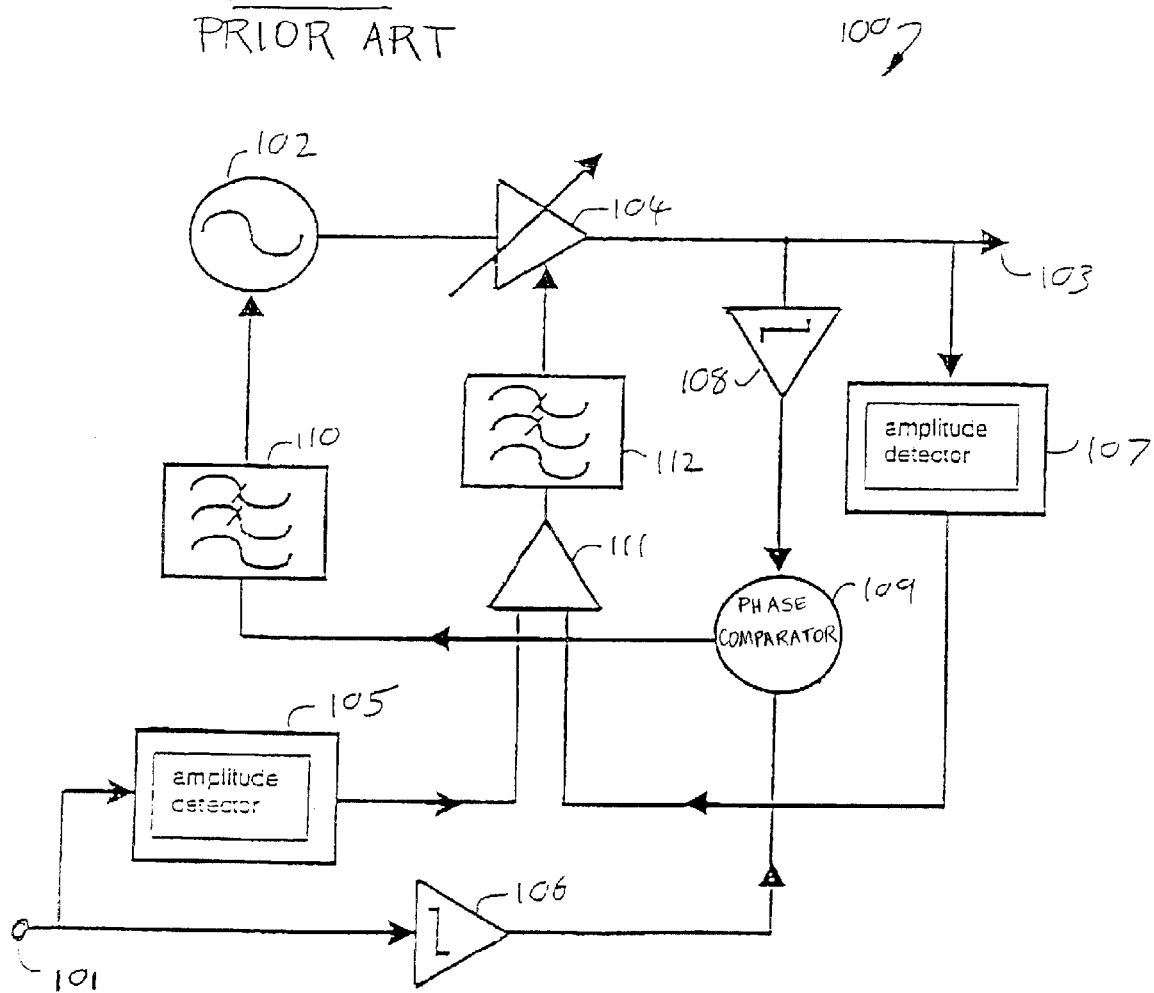
FIG. 1 is a schematic diagram of a prior art polar loop transmitter circuit arrangement.

Repeat use of reference characters throughout the present specification and appended drawings is intended to represent same or analogous features or elements of the presently disclosed technology.

DETAILED DESCRIPTION OF THE PREFERRED EMBODIMENTS

Reference now will be made in detail to the presently preferred embodiments of the invention. Each example is provided by way of explanation of the related technology, which is not restricted to the specifics of the examples. In fact, it will be apparent to those skilled in the art that various modifications and variations can be made in the present subject matter without departing from the scope or spirit of the subject matter. For instance, features illustrated or described as part of one embodiment, can be used on another embodiment to yield a still further embodiment. Thus, it is intended that the present subject matter cover such modifications and variations as come within the scope of the appended claims and their equivalents.

Figure 2:
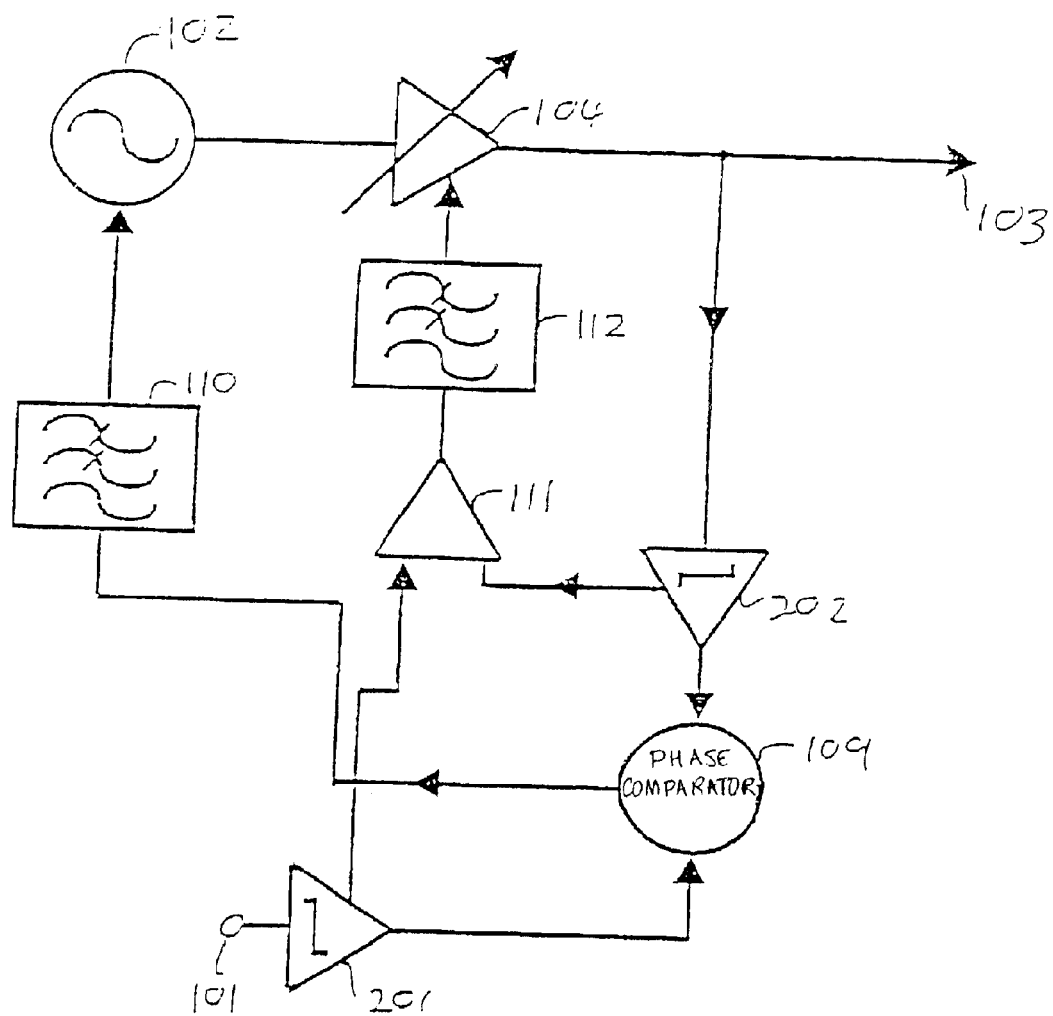
FIGS. 2 and 4 are schematic diagrams of polar loop transmitter circuit arrangements in accordance with the invention.
Figure 4:
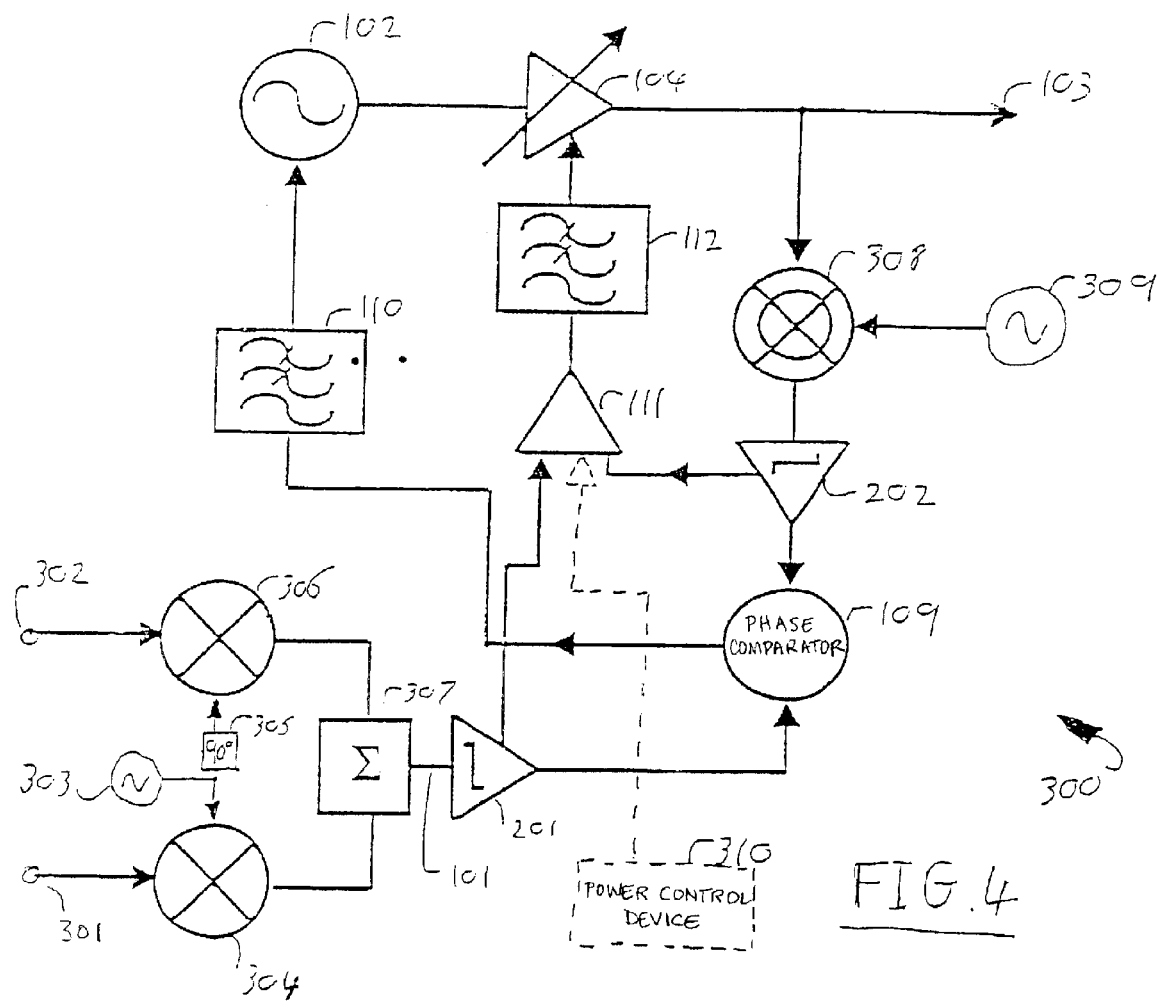

In FIGS. 2 and 4, certain reference numerals are the same as those used in FIG. 1 for like elements.

Referring to FIG. 2, a polar loop transmitter circuit arrangement 200 in accordance with the invention has, in place of the amplitude detectors 105, 107 and limiting amplifiers 106, 108 of the arrangement of FIG. 1, first and second amplifiers 201 and 202, which may be logarithmic amplifiers. Each of the amplifiers 201, 202 has two outputs, one output providing a signal containing information about the phase of the signal received at its input, and the other output providing a signal having an amplitude proportional to the logarithm of the amplitude of the signal received at its input. The outputs of the amplifiers 201, 202 which provide signals containing phase information are connected to respective ones of the inputs of the phase comparator 109. The outputs of the amplifiers 201, 202 which provide signals dependent on the amplitude of the input signal are connected to respective ones of the inputs of the comparator 111.

Figure 3:
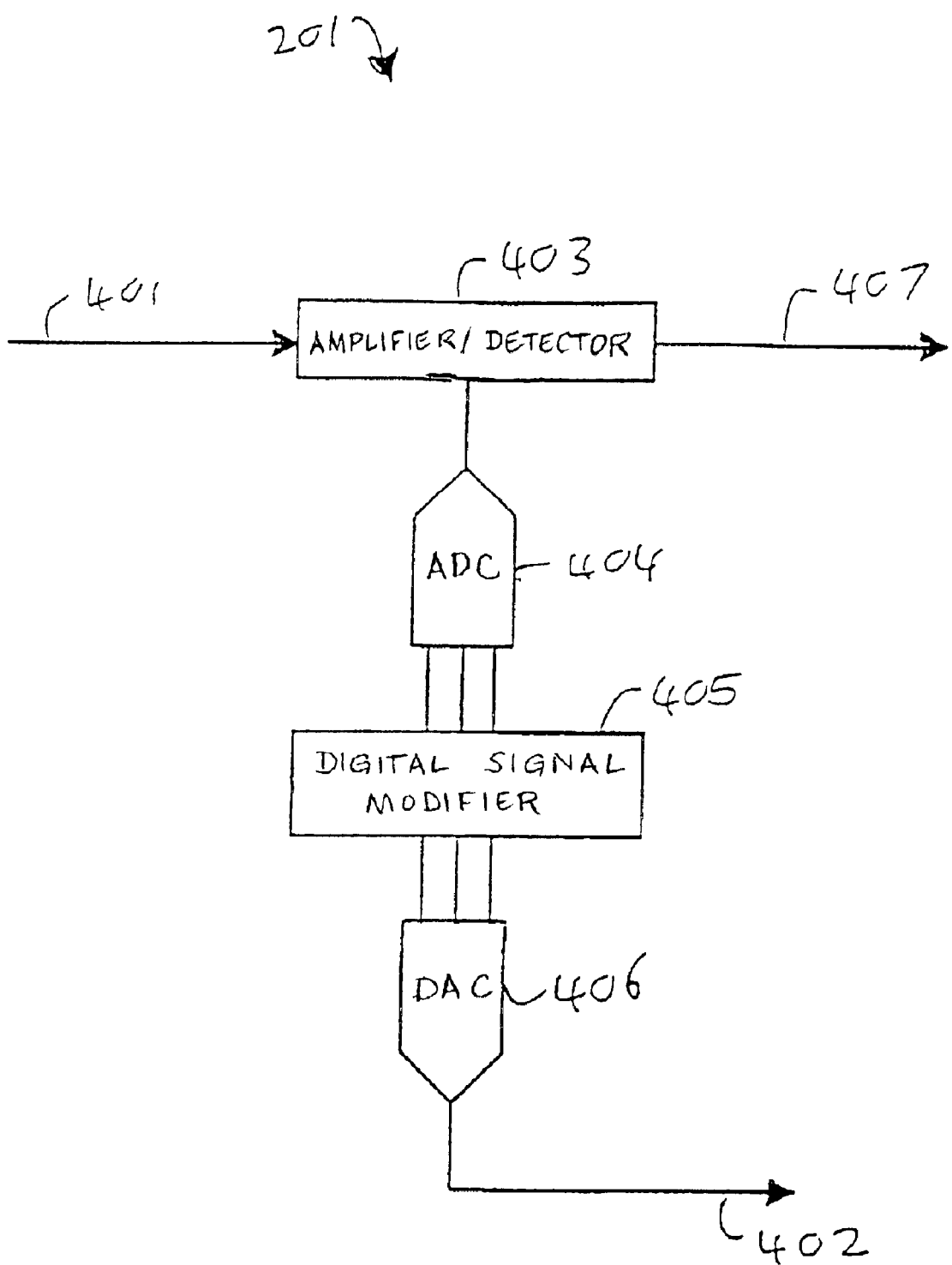
FIG. 3 is a schematic diagram of one form of amplifier used in the polar loop transmitters of FIGS. 2 and 4.

FIG. 3 is a schematic diagram of one form of the amplifiers 201, 202. Referring to FIG. 3, the amplifier 201 comprises in series between its input 401 and its input signal amplitude dependent output 402, an amplifier and detector component 403, an analog-to-digital converter (ADC) 404, a digital signal modifier 405 and a digital-to-analog converter (DAC) 406. The amplifier and detector component 403 also has a limited output 407, which provides a signal containing information about the phase of the signal received at the input 401. The other output of the amplifier and detector component 403 provides a signal having an amplitude which is proportional to the amplitude of the signal received at the input 401. This signal is sampled by the ADC 404 at a suitable sampling rate, and the samples are provided to the digital signal modifier 405.

In a preferred embodiment, the digital signal modifier 405 includes a read-only memory (not shown), in which is stored a look-up table. For each possible input value, the look-up table contains an output value that is equal to or generally equal to the logarithm of the input value. Accordingly, the DAC 406 always receives a value from the digital signal modifier 405 that is equal to or generally equal to the logarithm of the signal sampled by the ADC 404. An analog signal is constructed by the DAC 406 from values provided by the digital signal modifier 405, and the analog signal is then provided to the comparator 111 of FIG. 2.

Preferably, the read-only memory (not shown) of the digital signal modifier 405 is reprogrammable. In this case, a controller (not shown) is arranged to effect reprogramming to compensate for variables such as temperature and/or supply voltage.

In an alternative embodiment, the ADC 404, the digital signal modifier 405 and the DAC 406 are replaced by an analog circuit (not shown), which may include an operational amplifier having a non-linear feedback network. It should be appreciated that creating a logarithmic transfer function is within the purview of one of ordinary skill in the art and thus additional description of such is not presented herein.

An advantage achieved using the amplifiers 201, 202 having a logarithmic transfer function in the polar loop transmitter 200 is that, for any given difference in amplitude (in dB, i.e., having a given ratio therebetween) between the input 101 and the output 103, the difference voltage representing an error in amplitude is constant within the errors of the respective logarithmic amplifiers. Accordingly, the degree of error between the correct (ideal) amplitude and the actual amplitude of the modulated input signal provided at the output 103 is not dependent on the amplitude of the signal received at the input 101. Distortion of low input signal levels is thereby reduced. A polar loop transmitter having logarithmic amplifiers is described and claimed in U.S. patent application Ser. No. 10/114,429, which application is incorporated herein for all purposes by virtue of present reference thereto.

Although the use of amplifiers 201, 202 having logarithmic transfer functions is preferred, this is not essential. Indeed, many of the advantages achieved using amplifiers having logarithmic transfer functions can be achieved with amplifiers having other transfer functions.

Furthermore, this invention allows the use of amplifier and detector components 403 having a transfer function which is inconvenient for use with polar loop transmitters, since this can be compensated for in the signal modification circuitry. An amplifier and detector component 403 having a linear transfer function is described above since devices of this type are common. However, the invention allows the use of non-standard amplifiers and detector components, providing enhanced design freedom.

Referring now to FIG. 4, a second polar loop transmitter circuit arrangement 300 is shown, this being a modification of the polar loop transmitter circuit arrangement of FIG. 2. The polar loop transmitter 300 may further comprise in-phase and quadrature modulation inputs 301 and 302. Signals received at the inputs 301, 302 are mixed with, respectively, a signal provided by a local oscillator 303 in a first balanced modulator 304, and a version of the local oscillator signal, shifted by a 90° phase shifter 305, in a second balanced modulator 306. In-phase and quadrature local oscillator signals may be provided instead through the use of a different phase shift network, such as one including a +45° phase shifter and a −45° phase shifter. Outputs of the balanced modulators 304 and 306 are provided to a combiner 307, which combines the signals received at its inputs, and provides the result via the input 101 to the first amplifier 201.

A mixer 308 may be connected between the RF output 103 of the transmitter and the input of the second amplifier 202. The mixer 308 receives a signal provided by a frequency determining source 309, which may be a frequency synthesizer. The frequency of operation of the frequency determining source is selected such that signals at the output of the mixer 308 are of the same nominal frequency as signals at the input 101. This allows the output frequency to differ from the input frequency, and also reduces the negative effects of spurious signals, including signal intermodulation products.

In one embodiment, the mixer 308 is a conventional mixer and filtering is provided to remove or to reduce the image frequency signals generated by the mixer. This filtering may be provided by frequency roll-off in the mixer 308, by frequency roll-off in the logarithmic amplifier 202, or by a discrete filter (not shown) connected between the mixer 308 and the second amplifier 202. In a more particular embodiment, the mixer 308 is an image-reject mixer, as represented in FIG. 4.

The polar loop transmitter 300 as described above may be modified by providing comparator 111 with a third input, and by the connection of an output of a power control device 310 to this third input. This is shown in dotted lines in FIG. 4. The amplitude of a signal provided to the comparator 111 by the power control device 310 helps to determine the power of signals provided at the output 103. This constitutes a particularly convenient scheme for effecting power control. When the polar loop transmitter 300 is used in a time division multiple access (TDMA) or similar system, the power control device 310 effects shaping (i.e., rounding) of the rise and fall of the power of the signal provided at the output 103 to reduce the effects of "splatter" or "key clicks," which are produced by sharp edged radio frequency (RF) envelopes.

A polar loop transmitter in accordance with this invention has potential applications in many fields, including cellular radio. Where transmitters of minimum power consumption are required, and complexity and cost constraints are such that minimum geometry semiconductor fabrication techniques are desirable, certain difficulties arise even when small amounts of RF power are required. Difficulties can arise when only low voltage supplies are allowable, since this can require the use of low impedances. Similarly, because of these constraints, it is desirable to minimize the number of external filters, but system requirements can place significant constraints on the wideband noise that can be produced. In turn, this leads to a requirement to maximize signal voltages, which can be incompatible with the allowable supply voltage of the semiconductor fabrication technique. Exemplary polar loop transmitters in accordance with the present invention allow for a large proportion of the circuitry to be implemented in minimum geometry low supply voltage techniques. Additionally, the output amplifier 104, although shown as a modulated amplifier, could be a modulating stage followed by an amplifier. Such an amplifier could be a high efficiency amplifier operating in Class E, with the distortion products resulting from the use of non-constant envelope signals reduced by means of the amplitude feedback inherent in the system.

This invention can be implemented optically by substituting the oscillator 102 with a frequency modulated light source, such as a laser, and by substituting the controllable gain amplifier 104 with a device whose light transmissibility is proportional to an applied voltage, such as a Kerr cell. In this case, the image reject mixer 308 would be replaced with a photodetector fed by an additional laser element.

While at least one presently preferred embodiment of the invention has been described using specific terms, such description is for illustrative purposes only, and it is to be understood that changes and variations may be made without departing from the spirit or scope of the following claims.

What is claimed is:

1. A polar loop transmitter circuit arrangement comprising:
    a circuit input;
    a circuit output;
    a controllable signal source;
    a modulator connected between said controllable signal source and said circuit output;
    a first amplifier having an input connected to said circuit output;
    a second amplifier having an input connected to said circuit output;
    an output of each amplifier being connected to a respective input of a comparator; and
    an output of said comparator is connected to an input of said modulator, in which each of the amplifiers comprises an amplitude detector and a signal modifier connected in series between its input and its output and the output of the amplitude detector of each amplifier being connected to an input of the respective signal modifier.

2. A polar loop transmitter as claimed in claim 1, in which the amplifiers each have a transfer function that is generally logarithmic.

3. A polar loop transmitter circuit arrangement as in claim 1, further comprising a mixer connected between said circuit output and the input of said second amplifier.

4. A polar loop transmitter circuit arrangement as in claim 3, wherein said mixer is an image-reject mixer.

5. A polar loop transmitter circuit arrangement as in claim 1, further comprising a power control device connected to a third input of said comparator, wherein said power control device effects shaping of rising and falling power levels of a signal at said circuit output to reduce the effects of signal splatter.

6. A polar loop transmitter arrangement as in claim 1, wherein said signal modifiers each respectively include in series an analog-to-digital converter, a digital signal modifier, and a digital-to-analog converter.

7. A polar loop transmitter arrangement as in claim 6, in which each said digital signal modifier includes a memory containing a look-up table.

8. A polar loop transmitter as in claim 7, in which said memory is reprogrammable to compensate for changes in operating conditions.

9. A polar loop transmitter as claimed in claim 8, wherein said amplifiers each have a transfer function that is generally logarithmic.

10. A polar loop transmitter as claimed in claim 6, wherein said amplifiers each have a transfer function that is generally logarithmic.

11. A polar loop transmitter circuit arrangement as in claim 6, further comprising a mixer connected between said circuit output and the input of said second amplifier.

12. A polar loop transmitter circuit arrangement as in claim 11, wherein said amplifiers have a transfer function that is generally logarithmic.

13. A polar loop transmitter circuit arrangement as in claim 11, wherein said mixer is an image-reject mixer.

14. A polar loop transmitter circuit arrangement as in claim 6, further comprising a power control device connected to a third input of said comparator, wherein said power control device effects shaping of rising and falling power levels of the signal at said circuit output to reduce the effects of signal splatter.

15. A polar loop transmitter circuit arrangement as in claim 1, wherein said circuit input comprises first and second input nodes for receiving respective inphase and quadrature components of an input signal.

16. A polar loop transmitter circuit arrangement as in claim 1, further comprising a phase comparator configured to receive as inputs an output of said first amplifier and an output of said second amplifier, wherein said phase comparator provides an output connected to a control input of said controllable signal source, and further wherein said amplifiers each have a transfer function that is generally logarithmic.

17. A polar loop transmitter as in claim 16, wherein said amplifiers each have a transfer function that is generally logarithmic.

18. A polar loop transmitter as in claim 17, wherein said signal modifiers each respectively include in series an analog-to-digital converter, a digital signal modifier, and a digital-to-analog converter.

19. A polar loop transmitter circuit as in claim 16, further comprising:
 a first low-pass filter connected between said comparator output and the control input of said modulator; and
 a second low-pass filter connected between said phase comparator output and the control input of said controllable signal source.

20. A polar loop transmitter circuit as in claim 19, wherein said amplifiers each have a transfer function that is generally logarithmic and wherein said signal modifiers each respectively include in series an analog-to-digital converter, a digital signal modifier, and a digital-to-analog converter.

* * * * *